United States Patent [19]

Kaufman

[11] Patent Number: 4,724,514
[45] Date of Patent: Feb. 9, 1988

[54] LOW COST COMPRESSIVELY CLAMPED CIRCUIT AND HEAT SINK ASSEMBLY

[76] Inventor: Lance R. Kaufman, 131 N. White Oak Way, Mequon, Wis. 53092

[21] Appl. No.: 888,026

[22] Filed: Jul. 18, 1986

[51] Int. Cl.$^4$ ............................................. H05K 7/20
[52] U.S. Cl. .................................. 361/388; 165/185; 174/16 HS; 357/70; 357/81; 361/386; 361/421
[58] Field of Search ................................ 165/185, 803; 174/16 HS, 52 FP; 357/70, 79-82; 361/386-388, 401, 403, 414, 417-420, 421

[56] References Cited
U.S. PATENT DOCUMENTS

| | | |
|---|---|---|
| 3,766,440 | 10/1973 | Baird ................................... 361/388 |
| 3,958,075 | 5/1976 | Kaufman . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,266,140 | 5/1981 | Kaufman . |
| 4,394,530 | 7/1983 | Kaufman . |
| 4,449,165 | 5/1984 | Kaufman . |
| 4,449,292 | 5/1984 | Kaufman . |
| 4,488,202 | 12/1984 | Kaufman . |
| 4,498,120 | 2/1985 | Kaufman . |
| 4,546,410 | 9/1985 | Kaufman . |
| 4,546,411 | 9/1985 | Kaufman . |
| 4,554,613 | 11/1985 | Kaufman . |
| 4,574,162 | 3/1986 | Kaufman . |
| 4,577,387 | 3/1986 | Kaufman . |

FOREIGN PATENT DOCUMENTS 2840514 3/1979 Fed. Rep. of Germany .
8877379 7/1979 Japan .

Primary Examiner—Philip H. Leung
Assistant Examiner—Greg Thompson
Attorney, Agent, or Firm—Andrus, Sceales, Starke & Sawall

[57] ABSTRACT

An electrical circuit assembly (2) includes a heat sink (4), ceramic substrates (6, 6a) on top of the heat sink (4), heat generating electrical components (8a), including electronic circuit elements (10,10a) and a plurality of flat planar connecting lead frames (12,12a, (14,14a and 16,16a) on top of the substrates (6,6a) and a printed circuit board (26) on top of the flat lead frames (12,12a 14,14a and 16,16a). The printed circuit board (26) has a conductive pattern (28) on its underside electrically engaging and laying flat along the top planar surface of the flat lead frames (12,12a, 14,14a and 16,16a). A plurality of deformable rivets (52, 54, 56 and 58) extend downwardly through respective apertures (60, 62, 64 and 66) in the printed circuit board (26) and through respective apertures (68, 70, 72 and 74) in the heat sink. The rivets (52, 54, 56 and 58) have enlarged heads (76, 78, 80 and 82) engaging the top of the printed circuit board (26), and have bottom ends (84, 86, 88 and 90) deformed to engage the bottom of the heat sink (4) and compressively clamp the circuit arrangement in good heat transfer relation. The rivets (52, 54, 56 and 58) provide the sole clamping force, without nuts and bolts, etc.

20 Claims, 5 Drawing Figures

U.S. Patent  Feb. 9, 1988  4,724,514
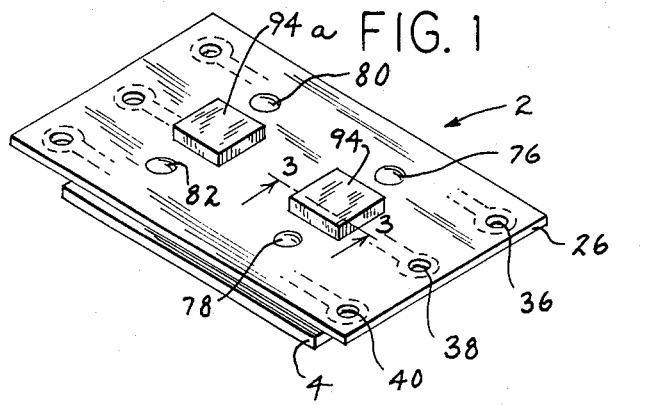
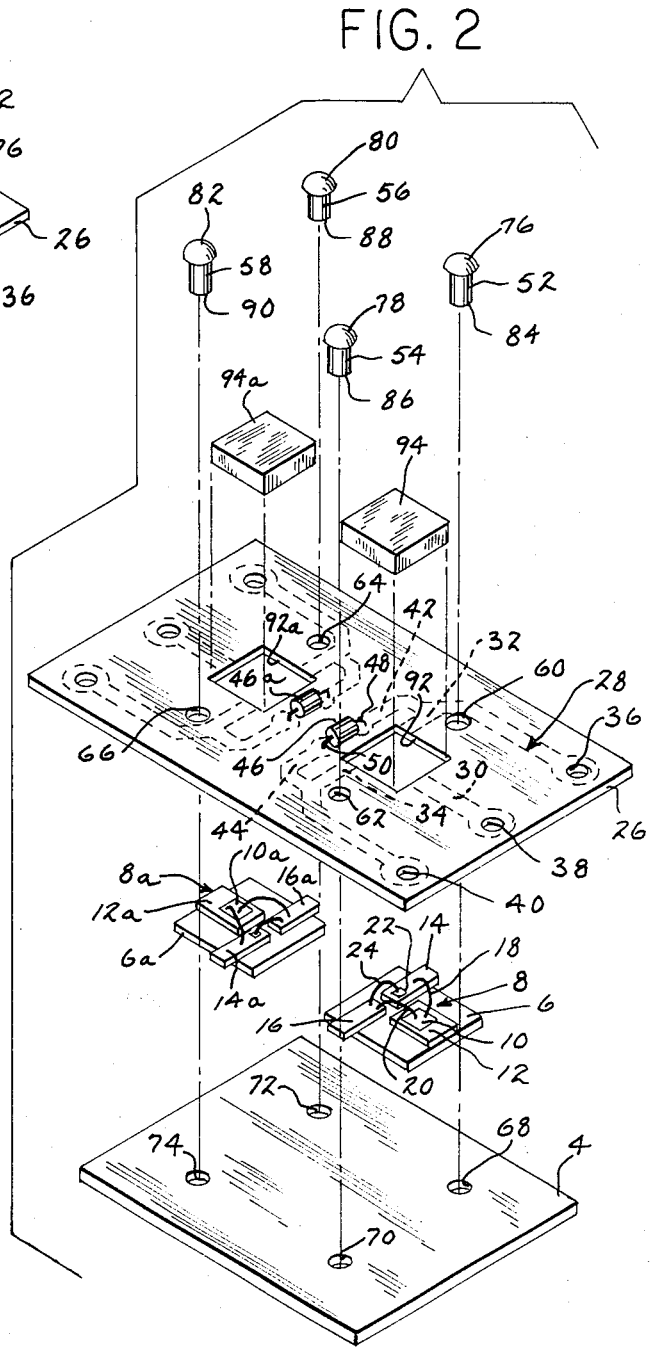
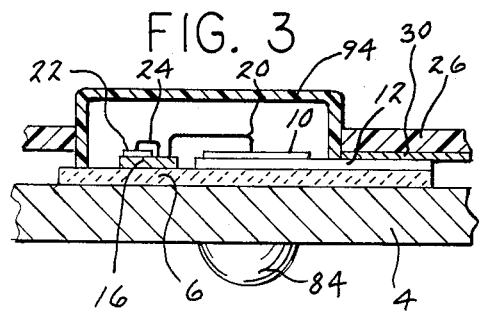
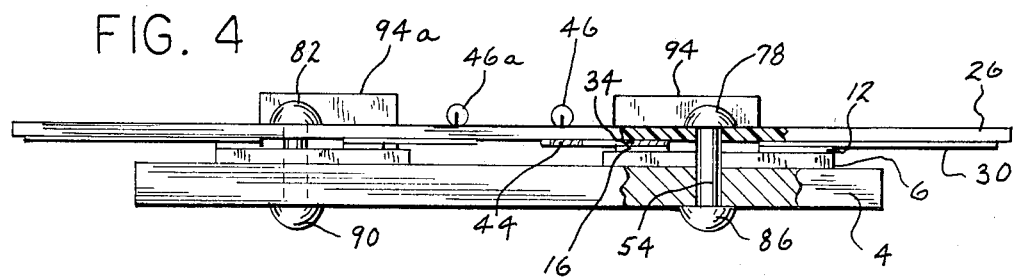

LOW COST COMPRESSIVELY CLAMPED CIRCUIT AND HEAT SINK ASSEMBLY

BACKGROUND AND SUMMARY

The invention relates to an electrical circuit assembly for mounting electronic circuit elements on a heat sink, and more particularly to a simple and cost effective compressive clamping arrangement.

BRIEF DESCRIPTION OF THE DRAWINGS

FIG. 1 is a perspective assembled view of an electrical circuit assembly constructed in accordance with the invention.

FIG. 2 is an exploded perspective view of the circuit assembly of FIG. 1.

FIG. 3 is a section view taken along line 3-3 of FIG. 1.

FIG. 4 is a side elevation view, partly in section, of the circuit assembly of FIG. 1.

FIG. 5 is a perspective view of an alternate embodiment of a portion of FIG. 1.

DETAILED DESCRIPTION

FIGS. 1 and 2 show an electrical circuit assembly 2 including a heat sink 4. An electrically insulating and heat conducting substrate 6, such as ceramic, is on the top of heat sink 4. Electrical components 8 are on top of substrate 6 and generate heat in response to the conduction of current through components 8. Electrical components 8 include an electronic circuit element, such as a semiconductor chip 10, and a plurality of flat planar lead frames 12, 14 and 16 electrically connected to circuit element 10. In the disclosed embodiment, circuit element 10 is a transistor with a bottom drain mounted on and connected to lead frame 12, a source connected by jumper wire 18 to lead frame 14, and a gate connected by jumper wire 20 to lead frame 16. A zener diode 22 is mounted on and connected to lead frame 14 and connected by jumper wire 24 to lead frame 16 to provide source to gate zener protection.

A printed circuit board 26 is on top of the flat lead frames and has a conductive pattern 28 on its underside electrically engaging and laying flat along the top planar surface of the flat lead frames. Conductive pattern 28 has a portion 30 contacting lead frame 12, a portion 32 contacting lead frame 14, and a portion 34 contacting lead frame 16, and brought out to respective terminal post connection apertures 38, 36 and 40 along the right side of printed circuit board 26 for external circuit connection. Portions 32 and 34 have respective branch portions 42 and 44 joined by a gate to source resistor 46 on top of circuit board 26. Resistor 46 has end terminals 48 and 50 extending downwardly through circuit board 26 to contact underside branch portions 42 and 44.

A plurality of deformable rivets 52, 54, 56 and 58 each extend downwardly through respective apertures 60, 62, 64 and 66 in printed circuit board 26 and respective apertures 68, 70, 72, and 74 in heat sink 4. The rivets have respective enlarged heads 76, 78, 80 and 82 at the top ends engaging the top of printed circuit board 26. The other bottom ends 84, 86, 88 and 90 are deformed to engage the bottom of the heat sink to compressively clamp printed circuit board 26 against flat lead frames 12, 14 and 16, and the flat lead frames against substrate 6, and substrate 6 against heat sink 4, to compressively force substrate 6 into intimate engagement with heat sink 4 to enhance heat transfer from electrical components 8 to heat sink 4. In the disclosed embodiment, the top ends of the rivets have enlarged heads 76, 78, 80 and 82, and the bottom ends of the rivets are deformed, for example as shown at bottom deformed ends 86 and 90, FIGS. 3, 4, In an alternative, the bottom ends of the rivet have enlarged heads and engage the bottom of the heat sink, and the top ends of the rivets are deformed to engage the top of the printed circuit board to provide the noted compressive clamping.

Rivets 52, 54, 56 and 58 are spaced concentrically about electrical components 8, or about a plurality of such components, to be described, and provide the sole clamping force, without extra elements such as nuts and bolts. In the disclosed embodiment, the rivets are plastic and are thermally deformed at their bottom ends 84, 86, 88 and 90 to provide the bottom enlarged heads as shown in FIGS. 3, 4 at 86 and 90. It is preferred that such thermal deformation be accomplished by sonic welding, though such deformation may be accomplished by various other melting or heating techniques. In an alternative, the rivets are staked at their bottom ends against the bottom of the heat sink. In another alternative, the rivets are split at their bottom ends and then mechanically crimped against the bottom of the heat sink.

Printed circuit board 26 has an aperture 92 therethrough around and spanning electronic circuit element 10 and a portion of lead frames 12, 14 and 16. Lead frames 12, 14 and 16 extend planarly laterally within aperture 92 and then beyond aperture 92 and beneath printed circuit board 26 to be engaged by respective portions 30, 32 and 34 of conductive pattern 28 on the underside of printed circuit board 26. The compressive clamping force is applied at the flat planar lead frame portions beneath conductive pattern portions 30, 32 and 34 on the underside of the printed circuit board. A cover 94 is mounted within aperture 92, FIG. 3, over circuit element 10. Substrate 6 has a lateral length greater than the lateral span of aperture 92. Rivets 52 and 54 are spaced laterally outwardly of aperture 92 and laterally outwardly of substrate 6.

The invention accommodates a plurality of clamped electrical components. A second set 8a of components is shown and uses the same reference characters as the above described first set, but with the suffix "a", to facilitate clarity. For example, a first semiconductor chip is shown at 10, and a second semiconductor chip is shown at 10a, a first set of lead frames is shown at 12, 14, and 16, and a second set of lead frames is shown at 12a, 14a, and 16a. A second substrate 6a, second resistor 46a, second aperture 92a and second cove 94a are also shown.

FIG. 5 shows an alternate embodiment of a clamping arrangement. Rivets 96, 98, 100 and 102 are joined together by a base portion 104. In the preferred alternative, base portion 104 is along the bottom of heat sink 4, and the rivets 96, 98, 100 and 102 are legs extending upwardly from the corners thereof through respective apertures 68, 70, 72 and 74 in heat sink 4, and through respective apertures 60, 62, 64 and 66 in printed circuit board 26. Base portion 104 has a lateral length greater than the lateral span of aperture 92 and greater than the lateral length of substrate 6. Base portion 104 provides the previously noted enlarged heads at the ends of the rivets. The end of rivets 96, 98, 100 and 102 opposite base portion 104 are deformed against the top of printed circuit board 26 to provide the above noted compressive clamping, again without nuts and bolts, etc.

It is recognized that various equivalents, alternatives and modifications are possible within the scope of the appended claims.

I claim:

1. An electrical circuit assembly comprising:
   a heat sink;
   an electrically insulating and heat conducting substrate on top of said heat sink;
   electrical component means on top of said substrate and generating heat in response to conduction of current through said electrical component means, said electrical component means including an electronic circuit element and a plurality of flat planar lead frames electrically connected to said element;
   a printed circuit board on top of said flat lead frames, said printed circuit board having a conductive pattern on its underside electrically engaging and laying flat against the top planar surface of said flat lead frames;
   a plurality of deformable rivets each extending downwardly through respective apertures in said printed circuit board and said heat sink, each rivet having an enlarged head at its top end engaging the top of said printed circuit board and having its bottom end deformed to engage the bottom of said heat sink and compressively clamping said printed circuit board against said flat lead frames, and said flat lead frames against said substrate, and said substrate against said heat sink, to compressively force said substrate into intimate engagement with said heat sink to enhance heat transfer from said electrical component means to said heat sink.

2. The invention according to claim 1 wherein said rivets are spaced concentrically about said electronic circuit element and provide the sole clamping force, without extra components such as nuts and bolts.

3. The invention according to claim 1 wherein said printed circuit board has an aperture therethrough around and spanning said electronic circuit element and a portion of said lead frames, and wherein said lead frames extend planarly laterally within and beyond said aperture and beneath said printed circuit board to be engaged by said conductive pattern on the underside of said printed circuit board.

4. The invention according to claim 3 wherein said substrate has a lateral length greater than the lateral span of said aperture, and wherein said rivets are spaced laterally outwardly of said aperture and laterally outwardly of said substrate.

5. The invention according to claim 4 comprising a cover mounted within said aperture over said electronic circuit element.

6. The invention according to claim 1 wherein said rivets are plastic and thermally deformed at said bottom end against the bottom of said heat sink.

7. The invention according to claim 1 wherein said rivets are plastic and sonically welded at said bottom end against the bottom of said heat sink.

8. The invention according to claim 1 wherein said rivets are staked at said bottom end against the bottom of said heat sink.

9. The invention according to claim 1 wherein said rivets are split and mechanically crimped at said bottom end against the bottom of said heat sink.

10. The invention according to claim 4 wherein said top ends of said rivets are joined together by a base portion along the top of said printed circuit board, said base portion having a lateral length greater than said lateral span of said aperture and greater than said lateral length of said substrate, said base portion providing said enlarged heads.

11. An electrical circuit assembly comprising:
    a heat sink;
    an electrically insulating and heat conducting substrate on top of said heat sink;
    electrical component means on top of said substrate and generating heat in response to conduction of current through said electrical component means, said electrical component means including an electronic circuit element and a plurality of flat planar lead frames electrically connected to said element;
    a printed circuit board on top of said flat lead frames, said printed circuit board having a conductive pattern on its underside electrically engaging and laying flat against the top planar surface of said flat lead frames;
    a plurality of deformable rivets each extending upwardly through respective apertures in said printed circuit board and said heat sink, each rivet having an enlarged head at its bottom end engaging the bottom of said heat sink and having its top end deformed to engage the top of said printed circuit board and compressibly pressing said printed circuit board against said flat lead frames, and said flat lead frames against said substrate, and said substrate against said heat sink, to compressibly force said substrate into intimate engagement with said heat sink to enhance heat transfer from said electrical component means to said heat sink.

12. The invention according to claim 11 wherein said rivets are spaced concentrically about said electronic circuit element and provide the sole clamping force, without extra components such as nuts and bolts.

13. The invention according to claim 11 wherein said printed circuit board has an aperture therethrough around and spanning said electronic circuit element and a portion of said lead frames, and wherein said lead frames extend planarly laterally within and beyond said aperture and beneath said printed circuit board to be engaged by said conductive pattern on the underside of said printed circuit board.

14. The invention according to claim 13 wherein said substrate has a lateral length greater than the lateral span of said aperture and wherein said rivets are spaced laterally outwardly of said aperture and laterally outwardly of said substrate.

15. The invention according to claim 14 comprising a cover mounted within said aperture over said electronic circuit element.

16. The invention according to claim 11 wherein said rivets are plastic and thermally deformed at said top end against the top of said printed circuit board.

17. The invention according to claim 11 wherein said rivets are plastic and sonically welded at said top end against the top of said printed circuit board.

18. The invention according to claim 11 wherein said rivets are staked at said top end against the top of said printed circuit board.

19. The invention according to claim 11 wherein said rivets are split and mechanically crimped at said top end against the top of said printed circuit board.

20. The invention according to claim 14 wherein said bottom ends of said rivets are joined together by a base portion along the bottom of said heat sink, said base portion having a lateral length greater than said lateral span of said aperture and greater than said lateral length of said substrate, said base portion providing said enlarged heads.

* * * * *